(12) United States Patent
Lee

(10) Patent No.: US 7,218,864 B2
(45) Date of Patent: May 15, 2007

(54) OPTICAL WAVELENGTH LOCKING APPARATUS AND METHOD FOR A MULTI-CHANNEL OPTICAL COMMUNICATION SYSTEM

(75) Inventor: Byung Tak Lee, Kyunggi-Do (KR)

(73) Assignee: LG-Nortel Co., Ltd., Seoul (KR)

( * ) Notice: Subject to any disclaimer, the term of this patent is extended or adjusted under 35 U.S.C. 154(b) by 636 days.

(21) Appl. No.: 10/190,493

(22) Filed: Jul. 9, 2002

(65) Prior Publication Data

US 2003/0011841 A1 Jan. 16, 2003

(30) Foreign Application Priority Data

Jul. 10, 2001 (KR) ................. 2001-41169

(51) Int. Cl.
*H04B 10/12* (2006.01)
(52) U.S. Cl. ............... 398/196; 398/85; 398/95
(58) Field of Classification Search ............ 398/45–48, 398/93–95, 195–197, 85; 372/32–34
See application file for complete search history.

(56) References Cited

U.S. PATENT DOCUMENTS

| | | | |
|---|---|---|---|
| 6,243,403 B1* | 6/2001 | Broutin et al. | 372/32 |
| 6,493,125 B1* | 12/2002 | Tanaka et al. | 398/95 |
| 6,693,932 B2* | 2/2004 | Akashi et al. | 372/32 |
| 6,763,047 B2* | 7/2004 | Daiber et al. | 372/34 |
| 6,785,308 B2* | 8/2004 | Dyer et al. | 372/29.02 |

* cited by examiner

*Primary Examiner*—Dzung Tran
(74) *Attorney, Agent, or Firm*—Ked & Associates, LLP

(57) ABSTRACT

An optical wavelength locking system is provided that includes a plurality of optical signal generating units for generating optical signals corresponding to a plurality of channels, and an optical wavelength locking unit for receiving the optical signals corresponding to the plurality of channels and sequentially controlling a wavelength fluctuation exhibited by the optical signal of each channel. Since one optical wavelength locking unit is used for a plurality of optical sources, production costs are reduced, a better utilization of available space can be achieved and the reliability of the system is improved.

14 Claims, 4 Drawing Sheets

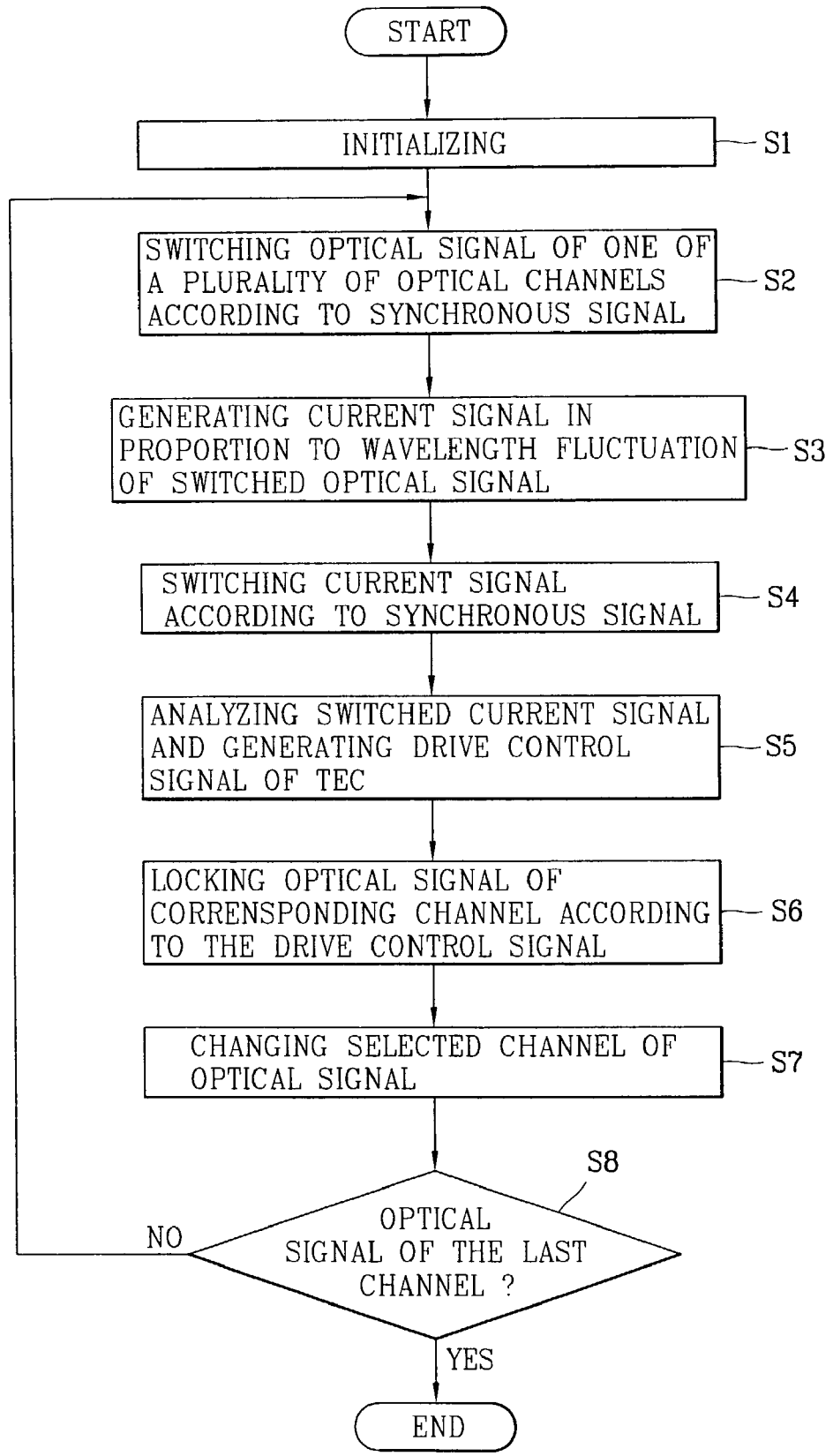

OPTICAL WAVELENGTH LOCKING APPARATUS AND METHOD FOR A MULTI-CHANNEL OPTICAL COMMUNICATION SYSTEM

BACKGROUND OF THE INVENTION

1. Field of the Invention

The present invention relates to an optical communication system, and more particularly, to an optical wavelength locking apparatus and method for a multi-channel optical communication system to stabilize the wavelength of an optical source.

2. Background of the Related Art

In general, in order to obtain ultra-high speed communication through an optical fiber, an optical communication system employs an optical multiplexing method such as optical time division multiplexing (OTDM), wavelength division multiplexing (WDM), or optical frequency division multiplexing (OFDM).

Among the multiplexing methods, the WDM method is used to divide/transfer an input channel to mutually different wavelength bands (e.g., 1.3 mm and 1.5 mm). WDM has advanced to a dense WDM (DWDM) method in which the wavelength bands are more closely spaced. DWDM can be used, for example, to divide/transfer the 1.5 mm wavelength band to a plurality of closely spaced wavelength bands.

Typically, an optical communication system employing the DWDM method uses an optical wavelength locking apparatus to restrain losses between optical channels. In this respect, if the wavelength spacing between optical channels is 0.4 nm, an optical wavelength locking circuit is needed in order to restrain wavelength fluctuations of the transmission optical source to within ±20 pm.

FIG. 1 is a block diagram of an optical wavelength locking apparatus for a single-channel system, in accordance with the related art.

As shown in FIG. 1, a related art optical wavelength locking apparatus for a single-channel system includes a laser diode 10 for converting transmission data into an optical signal, an optical tap 12 for separating a portion of the optical signal output from the laser diode 10, an optical wavelength locking unit 14 for analyzing the separated optical signal and outputting a control signal ($I_{TEC}$) to control a wavelength fluctuation ($\delta\lambda$) of the optical signal, and a thermoelectric cooler (TEC) 16 for controlling the temperature of the laser diode 10 according to the control signal ($I_{TEC}$) output from the optical wavelength locking unit 14.

The optical wavelength locking unit 14 includes an optical wavelength filter (OWF) 50 for outputting current signals ($I_A$, $I_B$) in proportion to the wavelength fluctuation ($\delta\lambda_1$) of the optical signal, and a control circuit 52 for outputting a control signal ($I_{TEC}$) to drive the TEC 16 according to the current signals ($I_A$, $I_B$) output from the OWF 50.

The operation of the conventional optical wavelength locking apparatus for a single-channel system constructed as described will now be explained.

The laser diode 10 converts data to be transmitted into an optical signal, and outputs the optical signal to an optical fiber 11. The optical tap 12 separates a portion of the optical signal [$P(\lambda+\delta\lambda)$] transmitted through the optical fiber 11 and sends it to the optical wavelength locking unit 14.

The OWF 50 of the optical wavelength locking unit 14 receives the optical signal [$P(\lambda+\delta\lambda)$] output from the optical tap 12 and outputs current signals ($I_A$, $I_B$) in proportion to the wavelength fluctuation ($\delta\lambda$). The control circuit 52 generates a control signal ($I_{TEC}$) according to a difference between the current signals ($I_A$, $I_B$). The difference between the current signals ($I_A$, $I_B$) is proportional to the wavelength fluctuation ($\delta\lambda$).

Accordingly, the TEC 16 controls a temperature of the laser diode 10 according to a control signal ($I_{TEC}$) output from the control circuit 52. That is, the TEC 16 is cooled or heated according to a polarity of the control signal ($I_{TEC}$), and thereby controls the temperature of the laser diode 10. By adjusting the temperature of the laser diode 10, the wavelength fluctuation ($\delta\lambda$) of the optical signal emitted from the laser diode 10 may be controlled.

As described above, the related art optical wavelength locking apparatus for a single-channel system includes one optical wavelength locking unit 14 for one transmission optical source (e.g., laser diode 10) to control the wavelength fluctuation of the optical signal emitted from the laser diode 10.

FIG. 2 is a block diagram illustrating a related art optical wavelength locking apparatus for a multi-channel system. As shown in FIG. 2, the related art optical wavelength locking circuit for a multi-channel system includes a plurality of optical wavelength locking units, with each optical wavelength locking unit being similar to the one used in the single channel system illustrated in FIG. 1.

That is, optical taps (12-1~12-N), optical wavelength locking units (14-1~14-N) and TECs (16-1~16-N) are respectively used for each of a plurality of laser diodes (10-1~10-N), so as to control the wavelength fluctuation of optical signals emitted from each of the plurality of laser diodes (10-1~10-N). Thus, in the related art optical wavelength locking apparatus for a multi-channel system, an optical wavelength locking unit is provided for every laser diode. Accordingly, if there are N number of transmission channels, then N number of optical wavelength locking units are required.

The optical wavelength filter used in each optical wavelength locking unit is a very expensive precision optical component. Thus the production costs involved in implementing an optical wavelength locking apparatus in a multi-channel system are high.

In addition, in the related art optical wavelength locking apparatus for a multi-channel system, since every laser diode needs a respective optical wavelength locking unit, installation space is increased. Further, since the wavelength fluctuation of optical signals in each channel is controlled by a different optical wavelength locking unit, the reliability of the system is degraded.

Another related art optical wavelength locking apparatus for a multi-channel system uses an arrayed waveguide grating (AWG). However, AWGs have limited wavelength resolution and precision.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Therefore, an object of the present invention is to provide an optical wavelength locking apparatus and method for a multi-channel optical communication system that is capable of locking an optical signal of a multi-channel optical communication system by using a single optical wavelength locking unit.

To achieve at least the above objects, in whole or in part, there is provided an optical wavelength locking apparatus, including a plurality of optical signal generating units for generating optical signals corresponding to a plurality of channels, and an optical wavelength locking unit for receiving the optical signals corresponding to the plurality of channels and sequentially controlling a wavelength fluctuation exhibited by the optical signal of each channel.

To achieve at least these advantages, in whole or in part, there is further provided an optical wavelength locking apparatus, including a plurality of optical sources for generating respective optical signals, a plurality of thermoelectric coolers (TECs) for controlling temperatures of the plurality of optical sources, a plurality of optical taps for separating the optical signals generated from the optical sources, and an optical wavelength locking unit for receiving the plurality of optical signals from the optical taps and outputting respective control signals corresponding to wavelength fluctuations exhibited by each optical signal to a respective TEC.

To achieve at least these advantages, in whole or in part, there is further provided an optical wavelength locking apparatus, including a first switch for switching one of a plurality of optical signals respectfully output by a plurality of optical sources, an optical wavelength filter for outputting a current signal in proportion to a wavelength fluctuation of the switched optical, a second switch for switching a current signal output by the optical wavelength filter, and a control circuit for analyzing the switched current signal, and generating a temperature control signal to sequentially control the wavelength fluctuations of the optical signals.

To achieve at least these advantages, in whole or in part, there is further provided an optical system, including a plurality of optical sources for generating a plurality of optical signals, and an optical wavelength locking unit configured to receive at least a portion of each of the plurality of optical signals, wherein the optical wavelength locking unit sequentially analyzes wavelength fluctuations exhibited by each of the plurality of optical signals and sends a control signal to the corresponding optical source for reducing the wavelength fluctuations.

To achieve at least these advantages, in whole or in part, there is further provided an optical wavelength locking system, including a switch for selecting one of a plurality of input optical signals generated by respective optical sources, an optical waveguide filter configured to receive the selected optical signal and generate an electrical signal that is proportional to wavelength fluctuations exhibited by the selected optical signal, and a controller that sends the electric signal to an optical source that generated the selected optical signal.

To achieve at least these advantages, in whole or in part, there is further provided an optical wavelength locking method, including the steps of generating optical signals corresponding to a plurality of channels, and receiving the optical signals and sequentially controlling a wavelength fluctuation exhibited by each optical signal.

To achieve at least these advantages in whole or in part, there is further provided an optical wavelength locking method, including the steps of receiving optical signals corresponding to a plurality of channels, selecting an optical signal for one channel, analyzing the selected optical signal and controlling a wavelength fluctuation of the selected optical signal, and sequentially selecting an optical signal for another channel.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 5 is a flow chart of an optical wavelength locking method for the multi-channel optical communication system of FIG. 3, in accordance with one preferred embodiment of the present invention.

DETAILED DESCRIPTION OF PREFERRED EMBODIMENTS

One preferred embodiment of the present invention will now be described with reference to the accompanying drawings.

Figure 1:
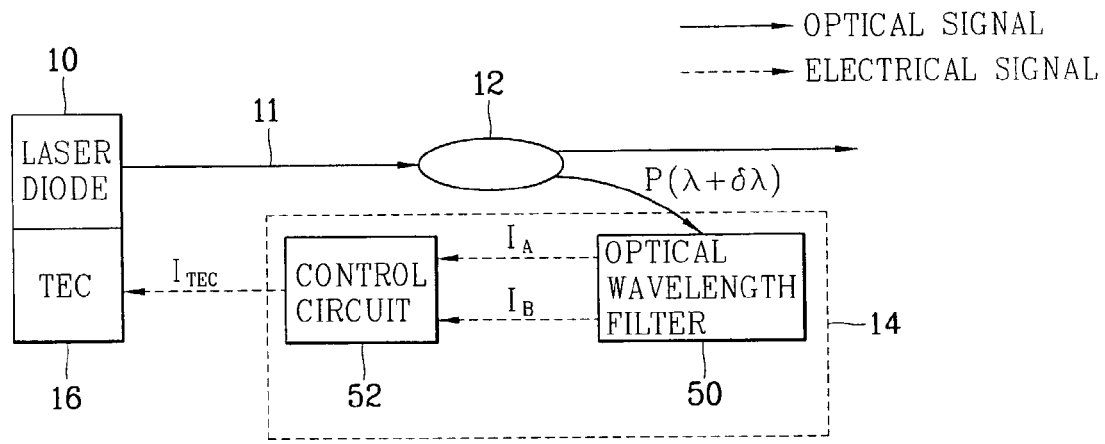
FIG. 1 is a schematic block diagram of an optical wavelength locking apparatus for a single channel system, in accordance with the related art.
Figure 2:
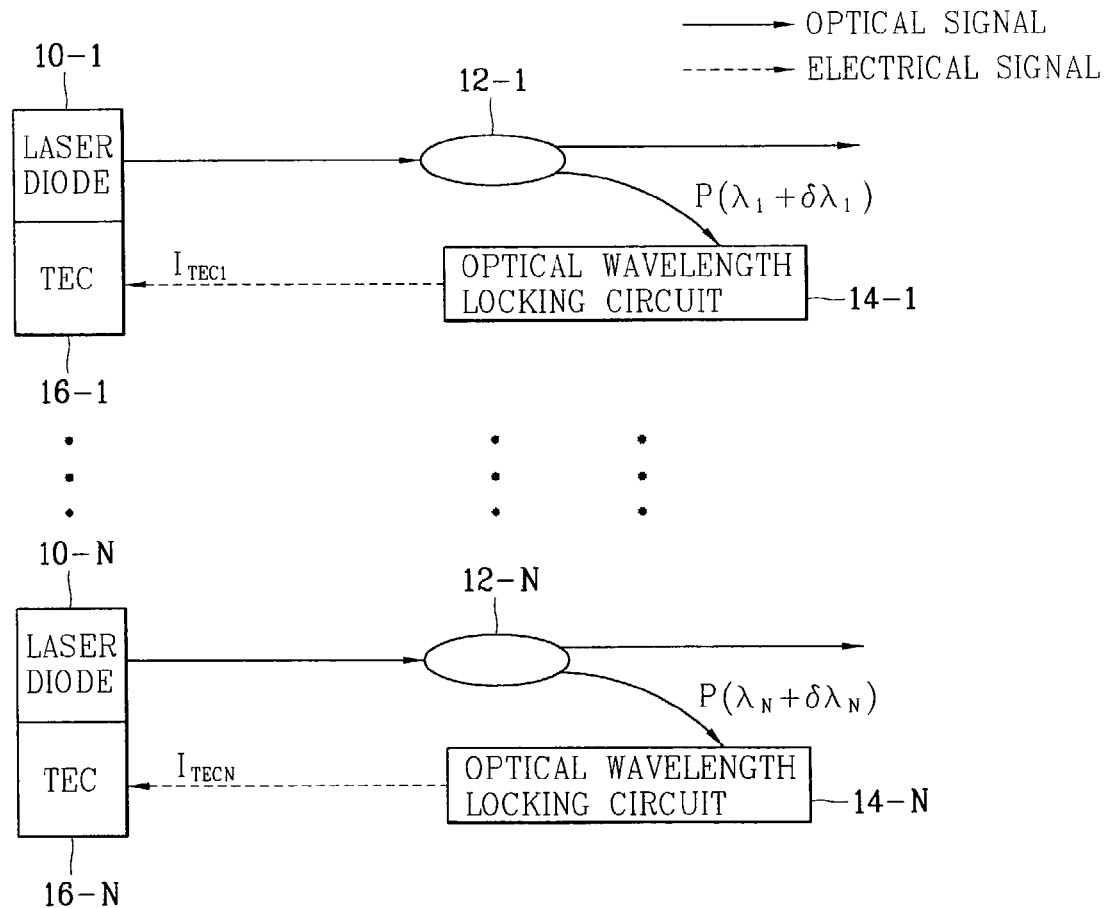
FIG. 2 is a schematic block diagram of an optical wavelength locking apparatus for a multi-channel optical system, in accordance with the related art.
Figure 3:
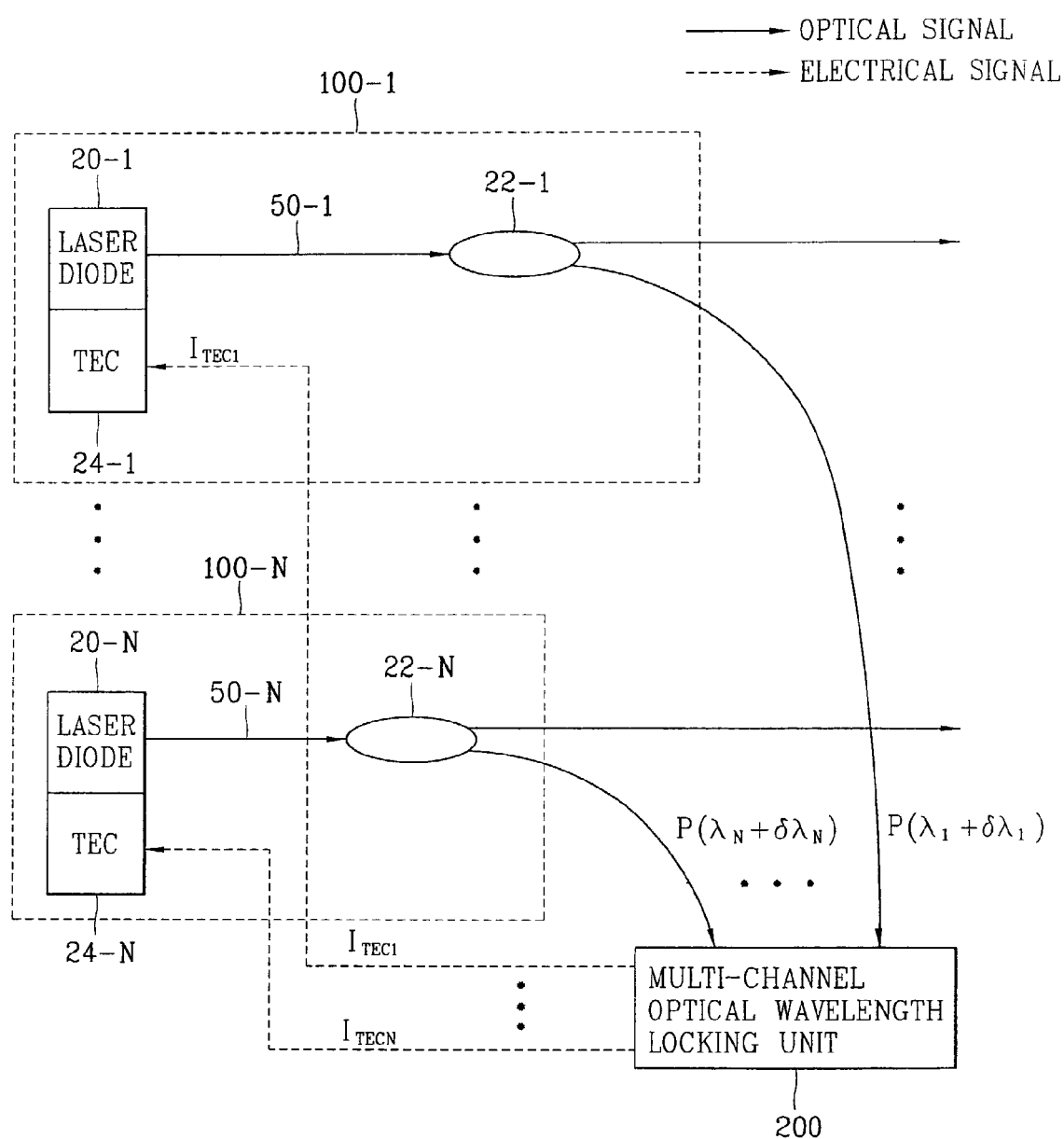
FIG. 3 is a schematic block diagram of an optical wavelength locking apparatus for a multi-channel optical communication system, in accordance with one preferred embodiment of the present invention.

FIG. 3 is a schematic block diagram of an optical wavelength locking apparatus for a multi-channel optical communication system, in accordance with one preferred embodiment of the present invention.

As shown in FIG. 3, an optical wavelength locking apparatus for a multi-channel optical communication system, in accordance with one embodiment of the present invention, includes a plurality of optical signal generators 100-1~100-N for generating optical signals for N number of channels, and a multi-channel optical wavelength locking unit 200 for controlling wavelength fluctuations in each of the optical signals generated by each of the optical signal generators (100-1~100-N). That is, the present invention utilizes a single multi-channel optical wavelength locking unit 200 for the plurality of optical sources (e.g., for the plurality of laser diodes).

The plurality of optical signal generators (100-1~100-N) respectively include a laser diode 20-1~20-N for generating an optical signal, an optical tap 22-1~22-N for separating a portion of the optical signal emitted from the laser diode 20-1~20-N and providing it to the multi-channel optical wavelength locking unit 200, and a TEC 24-1~24-N for controlling a temperature of the laser diode 22-1~20-N.

Figure 4:
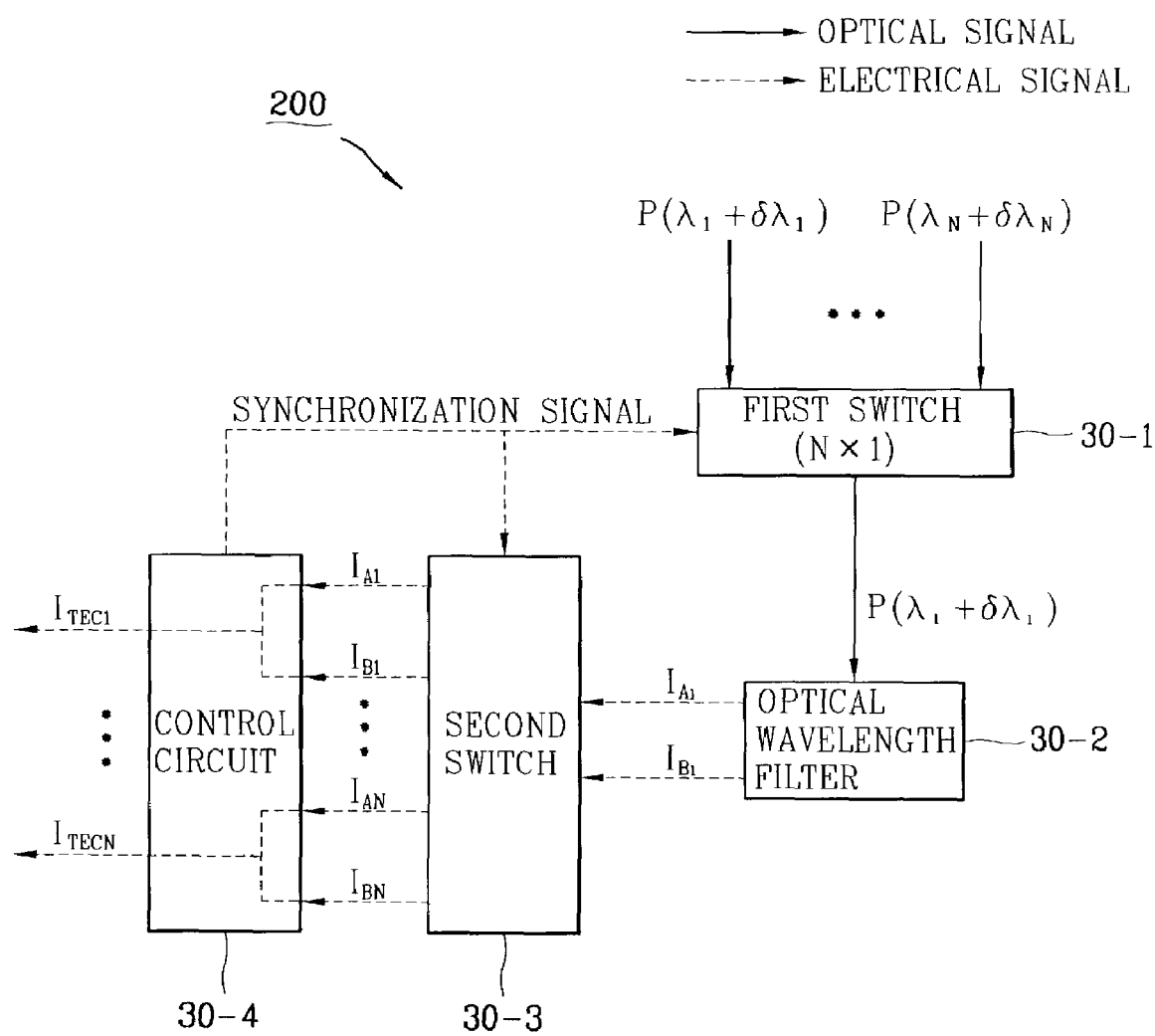
FIG. 4 is a schematic block diagram of the optical wavelength locking unit used in the multi-channel optical communication system of FIG. 3, in accordance with one preferred embodiment of the present invention.

As shown in FIG. 4, the multi-channel optical wavelength locking unit 200 includes a first switch 30-1 for selectively outputting the optical signal in one channel among optical signals $[P(\lambda_i+\delta\lambda_i)]$ (i=1, ..., N) of the N number of channels according to a synchronous signal, an optical wavelength filter (OWF) 30-2 for outputting a current signal $(I_{A1}, I_{B1})$ in proportion to the wavelength fluctuation $(\delta\lambda i)$ of the optical signal output from the first switch 30-1, a second switch 30-3 for switching the current signal ($I_{A1}$, $I_{Bi}$) output from the OWF 30-2 according to a synchronous signal, and a control circuit 30-4 for generating a drive control signal ($I_{TEC1}$) for the TEC 24-1~24-N according to a difference between the current signals $I_{A1}$ and $I_{B1}$ output from the second switch 30-3.

The operation of the multi-channel optical wavelength locking apparatus described above will now be explained with reference to the accompanying drawings.

The laser diodes 20-1~20-N of the optical signal generators 100-1~100-N convert data to be transmitted to optical signals and transmit the optical signals to the optical fibers 50-1~50-N. The optical taps 22-1~22-N separate a portion of each of the optical signals transmitted through the optical fibers 50-1~50-N, and send the portion of the optical signal to the multi-channel optical wavelength locking unit 200.

The multi-channel optical wavelength locking unit 200 sequentially selects the optical signals [$P(\lambda_1+\delta\lambda_1)$] (i=1, ..., N) of the N number of channels separated from the optical taps 22-1~22-N, generates drive control signals ($I_{TEC1}$~$I_{TECN}$) corresponding to the wavelength fluctuations ($\delta\lambda_1$~$\delta\lambda_N$), respectively, of the optical signals and outputs them to the plurality of TECs (24-1~24-N), respectively.

Accordingly, the TECs 24-1~24-N control the temperature of the laser diodes 20-1~20-N according to the drive control signals $I_{TEC1}$~$I_{TECN}$ output from the multi-channel optical wavelength locking unit 200, so that the wavelength fluctuations $\delta\lambda_1$~$\delta\lambda_N$ for the optical signals of the N number of channels emitted from the laser diodes 20-1~20-N can be controlled.

The above operation will now be described in detail. As shown in FIG. 5, after the optical communication system is initiated, when optical signals [$P(\lambda_1+\delta\lambda_1)$] (i=1, ..., N) of the N number of channels are input from the optical taps 22-1~22-N, the first switch 30-1 switches an optical signal of one channel among the optical signals [$P(\lambda_1+\delta\lambda_1)$] (i=1, ..., N) of the N number of channels (e.g., an optical signal [$P(\lambda_1+\delta\lambda_1)$] of the first channel) to the OWF 30-2 (steps S1 and S2).

Then, the OWF 30-2 outputs current signals ($I_{A1}$, $I_{B1}$) in proportion to the wavelength fluctuation ($\delta\lambda_1$) of the switched optical signal [$P(\lambda_1+\delta\lambda_1)$] (step S3), and the second switch 30-3 switches the current signals ($I_{A1}$, $I_{B1}$) outputted from the OWF 30-2 to the control circuit 30-4 (step S4).

The control circuit 30-4 analyzes the input current signals ($I_{A1}$, $I_{B1}$) and generates a drive control signal ($I_{TEC1}$) corresponding to the difference signal between the corresponding current signals ($I_{A1}$, $I_{B1}$). The TEC 24-1 controls the temperature of the laser diode 20-1 according to the drive control signal ($I_{TEC1}$) generated from the control circuit 30-4.

Accordingly, as the temperature of the laser diode 20-1 is controlled, the wavelength fluctuation ($\delta\lambda_1$) of the optical signal [$P(\lambda l_1+\delta\lambda_1)$] is controlled, so that the optical signal [$P(\lambda_1+\delta\lambda_1)$] is stabilized (step S6). Thereafter, the control circuit 30-4 outputs a synchronous signal to the first and second switches 30-1 and 30-3 to change the selected channel of the optical signal (step S7).

Thus, in the same manner, the first switch 30-1 sequentially switches the optical signals [$P(\lambda_2+\delta\lambda_2)$~$P(\lambda_N+\delta\lambda_N)$] from the second channel to the Nth channel according to the synchronous signal, and the OWF 30-2 outputs current signals [($I_{A2}$, $I_{B2}$)~($I_{AN}$, $I_{BN}$)] in proportion to the wavelength fluctuations ($\delta\lambda_2$~$\delta\lambda_N$) of the optical signals [$P(\lambda_2+\delta\lambda_2)$~$P(\lambda_N+\delta\lambda_N)$].

Then, the control circuit 30-4 sequentially receives the current signals [($I_{A2}$, $I_{B2}$)~($I_{AN}$, $I_{BN}$)] from the OWF 30-2 through the second switch 30-3 and outputs control signals ($I_{TEC2}$~$I_{TECN}$). The TECs (24-2~24-N) then control the temperature of laser diodes 20-2~20-N so as to control the wavelength fluctuations ($\delta\lambda_2$~$\delta\lambda_N$) of the optical signals radiated from the laser diodes (20-1~20-N). Thereafter, when the stabilization of optical signals for the N number of channels are completed, the control circuit 30-4 terminates the process (step S8).

The optical wavelength locking apparatus and method of the present invention has at least the following advantages. Since one optical wavelength locking unit is used for a plurality of optical sources, a production cost of the optical wavelength locking apparatus can be reduced. In addition, since one optical wavelength locking unit is used for a plurality of optical sources, a better utilization of available space can be achieved and the reliability of the system is improved.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structure described herein as performing the recited function and not only structural equivalents but also equivalent structures. For example, although an optical fiber and a thin-film dielectric waveguide may not be structural equivalents in that an optical fiber employs a solid dielectric filament to guide light, whereas a thin-film dielectric waveguide employs a deposited thin film, in the environment of guiding light, an optical fiber and a thin-film dielectric waveguide may be equivalent structures.

What is claimed is:

1. An optical wavelength locking apparatus, comprising:
   a plurality of optical sources for generating respective optical signals;
   a plurality of thermoelectric coolers (TECs) for controlling temperatures of the plurality of optical sources;
   a plurality of optical taps for sampling the optical signals generated from the optical sources; and
   an optical wavelength locking unit, comprising,
   a first switch for receiving the sampled optical signals from the plurality of optical taps and for selectively switching between the sampled optical signals;
   an optical wavelength filter for receiving a sampled optical signal selected by the first switch and for outputting a set of electrical signals proportional to the wavelength fluctuation of the selected sampled optical signal;
   a second switch for receiving sets of electrical signals corresponding to wavelength fluctuations of selected sampled optical signals from the optical wavelength filter and for selectively switching between the received sets of electrical signals; and
   a control circuit for generating a control signal based on a difference between electrical signals in the selected set of electrical signals, the control signal being operatively connected to one of the plurality of TECs corresponding to the selected sampled optical signal for controlling the wavelength fluctuation of the selected sampled optical signal,
   wherein the optical wavelength locking unit is useable for the plurality of optical signals eliminating the need for a different optical wavelength locking unit for each of the optical signals.

2. The apparatus of claim 1, wherein the control circuit outputs a channel selecting synchronous signal to the first and the second switches to select a different sampled optical signal and associated set of electrical signals.

3. An optical wavelength locking apparatus, comprising:
a plurality of optical signal generating units for generating optical signals corresponding to a plurality of channels; and
an optical wavelength locking unit, comprising,
a first switch for receiving the optical signal from each of the plurality of channels and for selectively switching between the received optical signals;
an optical wavelength filter for receiving an optical signal selected by the first switch and for outputting a set of electrical signals proportional to a wavelength fluctuation of the selected optical signal;
a second switch for receiving sets of electrical signals from the optical wavelength filter and for selectively switching between sets of electrical signals received from the optical wavelength filter; and
a control circuit for analyzing the selected set of electrical signals and generating a control signal for controlling the wavelength fluctuation of the selected optical signal based on a difference between electrical signals in the selected set of electrical signals,
wherein the optical wavelength locking unit is useable for all of the optical signals from each of the plurality of channels eliminating the need for a different optical wavelength locking unit for each of the optical signals.

4. The apparatus of claim 3, wherein the control circuit outputs a synchronous signal to the first and second switches to sequentially switch the optical signals corresponding to the plurality of channels.

5. An optical wavelength locking apparatus, comprising:
a first switch for selectively switching between a plurality of optical signals output by respective optical sources;
an optical wavelength filter for receiving an optical signal selected by the first switch and for outputting a set of electrical signals proportional to a wavelength fluctuation of the selected optical signal;
a second switch for selectively switching between sets of electrical signals received from the optical wavelength filter; and
a control circuit for analyzing the selected set of electrical signals, and generating a temperature control signal for controlling the wavelength fluctuations of the selected optical signal based on a difference between electrical signals in the set of selected electrical signals,
wherein the optical wavelength locking apparatus is useable for all of the optical signals from each of the respective optical sources eliminating the need for a different optical wavelength locking apparatus for each of the optical signals.

6. The apparatus of claim 5, wherein the control circuit outputs a channel selecting synchronous signal to the first and second switches.

7. An optical wavelength locking method in an optical wavelength locking apparatus, comprising:
generating optical signals corresponding to a plurality of channels;
receiving the optical signals;
selecting an optical signal corresponding to one channel;
generating an electrical signal that is proportional to a wavelength fluctuation of the selected optical signal;
adjusting a temperature of an optical source that generated the selected optical signal based on the generated electrical signal;
selecting a second optical signal corresponding to another channel; and
repeating the receiving, selecting, generating and adjusting for the second optical signal,
wherein the optical wavelength locking apparatus is useable for all of the optical signals from each of the respective plurality of channels eliminating the need for a different optical wavelength locking apparatus for each of the optical signals.

8. An optical system, comprising:
a plurality of optical sources for generating a plurality of optical signals; and
an optical wavelength locking unit configured to receive at least a portion of each of the plurality of optical signals, wherein the optical wavelength locking unit comprises,
a switch for receiving the plurality of optical signals and for selectively switching between optical signals;
an optical waveguide filter configured to receive an optical signal selected by the switch and generate a set of electrical signals proportional to the wavelength fluctuations exhibited by the selected optical signal; and
a controller that sends a control signal to the optical source that generated the selected optical signal based on a difference between electrical signals in the set of electrical signals.
wherein the optical wavelength locking unit is useable for all of the optical signals from each of the plurality of optical sources eliminating the need for a different optical wavelength locking unit for each of the optical signals.

9. The optical system of claim 8, wherein each optical source comprises a temperature controller, and wherein the control signal comprises a temperature control signal.

10. The optical system of claim 9, wherein each optical source comprises a laser diode in thermal communication with a thermoelectric cooler.

11. A wavelength division multiplexing system comprising the optical system of claim 8.

12. An optical wavelength locking system, comprising:
a switch for selectively switching between a plurality of input optical signals generated by respective optical sources;
an optical waveguide filter configured to receive an optical signal selected by the switch and generate a set of electrical signals proportional to wavelength fluctuations exhibited by the selected optical signal; and
a controller that sends a control signal to an optical source that generated the selected optical signal based on a difference between electrical signals in the set of electrical signals,
wherein the optical wavelength locking system is useable for all of the optical signals generated from each of the respective optical sources eliminating the need for a different optical wavelength locking system for each of the optical signals.

13. The system of claim 12, wherein an emission wavelength of the optical source that generated the selected optical signal can be controlled with temperature, and wherein the electrical signal comprises a temperature control signal.

14. The system of claim 13, wherein the optical source that generated the selected optical signal comprises a thermoelectric cooler configured to receive the temperature control signal.

* * * * *